US009917153B2

(12) United States Patent
Augendre et al.

(10) Patent No.: US 9,917,153 B2
(45) Date of Patent: Mar. 13, 2018

(54) METHOD FOR PRODUCING A MICROELECTRONIC DEVICE

(71) Applicant: Commissariat A L'Energie Atomique et aux Energies Alternatives, Paris (FR)

(72) Inventors: Emmanuel Augendre, Montbonnot (FR); Thierry Baron, Saint Egreve (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/753,662

(22) Filed: Jun. 29, 2015

(65) Prior Publication Data

US 2015/0380491 A1    Dec. 31, 2015

(30) Foreign Application Priority Data

Jun. 30, 2014  (FR) ...................... 14 56201

(51) Int. Cl.
*H01L 21/8234*  (2006.01)
*H01L 29/10*  (2006.01)
(Continued)

(52) U.S. Cl.
CPC ...... *H01L 29/1054* (2013.01); *H01L 21/0245* (2013.01); *H01L 21/0254* (2013.01);
(Continued)

(58) Field of Classification Search
None
See application file for complete search history.

(56) References Cited

U.S. PATENT DOCUMENTS 5,417,180 A    5/1995    Nakamura
5,948,162 A    9/1999    Nakamura
(Continued)

FOREIGN PATENT DOCUMENTS

WO    WO 2010/033813 A2    3/2010

OTHER PUBLICATIONS

French Preliminary Search Report dated Dec. 22, 2014 in French application 14 56201, filed on Jun. 30, 2014 ( with English Translation of Categories of Cited Documents and Written opinion).

*Primary Examiner* — Benjamin Sandvik
(74) *Attorney, Agent, or Firm* — Oblon, McClelland, Maier & Neustadt, L.L.P.

(57) ABSTRACT

A crystalline layer is produced from a crystalline substrate made from a first material on which a masking layer has previously been deposited; the masking layer containing at least one trench forming an access to the substrate, by:
  forming a crystalline buffer layer situated at least partly in the trench in the masking layer, extending from the substrate and forming a projection beyond the masking layer so that an upper part of the lateral flanks of said buffer layer is left uncovered, the formation step comprising a growth of the buffer layer from the substrate, and
  forming a crystalline epitaxial layer in a second material, different from the material of the buffer layer, by growth from said upper part of the lateral flanks of the buffer layer left uncovered.

34 Claims, 4 Drawing Sheets

(51) Int. Cl.
| | |
|---|---|
| H01L 21/02 | (2006.01) |
| H01L 29/66 | (2006.01) |
| H01L 21/306 | (2006.01) |
| H01L 21/308 | (2006.01) |
| H01L 21/31 | (2006.01) |
| H01L 21/311 | (2006.01) |
| H01L 21/324 | (2006.01) |
| H01L 29/04 | (2006.01) |
| H01L 29/165 | (2006.01) |
| H01L 29/20 | (2006.01) |
| H01L 29/205 | (2006.01) |
| H01L 29/78 | (2006.01) |

(52) U.S. Cl.
CPC .. *H01L 21/02381* (2013.01); *H01L 21/02452* (2013.01); *H01L 21/02458* (2013.01); *H01L 21/02463* (2013.01); *H01L 21/02532* (2013.01); *H01L 21/02535* (2013.01); *H01L 21/02546* (2013.01); *H01L 21/02598* (2013.01); *H01L 21/02636* (2013.01); *H01L 21/02639* (2013.01); *H01L 21/3081* (2013.01); *H01L 21/30604* (2013.01); *H01L 21/30612* (2013.01); *H01L 21/31* (2013.01); *H01L 21/31116* (2013.01); *H01L 21/324* (2013.01); *H01L 21/3245* (2013.01); *H01L 21/823431* (2013.01); *H01L 29/04* (2013.01); *H01L 29/165* (2013.01); *H01L 29/2003* (2013.01); *H01L 29/205* (2013.01); *H01L 29/66795* (2013.01); *H01L 29/785* (2013.01); *H01L 29/7849* (2013.01)

(56) References Cited

U.S. PATENT DOCUMENTS

| | | | |
|---|---|---|---|
| 2010/0025683 A1 | 2/2010 | Cheng | |
| 2010/0216277 A1 | 8/2010 | Fiorenza et al. | |
| 2011/0049568 A1 | 3/2011 | Lochtefeld et al. | |
| 2011/0210374 A1* | 9/2011 | Lochtefeld | H01L 29/66795 257/190 |
| 2012/0068226 A1 | 3/2012 | Hydrick et al. | |
| 2012/0088344 A1* | 4/2012 | van Dal | H01L 21/02381 438/283 |
| 2013/0037869 A1* | 2/2013 | Okano | H01L 29/66795 257/288 |
| 2013/0069128 A1* | 3/2013 | Okano | H01L 29/66795 257/288 |
| 2013/0089958 A1* | 4/2013 | Yeh | H01L 29/66818 438/197 |
| 2013/0105860 A1* | 5/2013 | Lochtefeld | H01L 21/02381 257/190 |
| 2013/0119347 A1* | 5/2013 | Cho | H01L 29/66462 257/24 |
| 2013/0134480 A1 | 5/2013 | Hydrick et al. | |
| 2013/0234204 A1* | 9/2013 | Kang | H01L 29/7851 257/190 |
| 2013/0285116 A1 | 10/2013 | Lochtefeld et al. | |
| 2014/0106546 A1 | 4/2014 | Lochtefeld et al. | |
| 2014/0191330 A1* | 7/2014 | Cheng | H01L 21/823431 257/390 |
| 2014/0264607 A1* | 9/2014 | Basu | H01L 29/785 257/365 |
| 2014/0273359 A1* | 9/2014 | Kim | H01L 29/66795 438/156 |
| 2015/0079766 A1 | 3/2015 | Baron et al. | |
| 2015/0295090 A1* | 10/2015 | Tsai | H01L 29/66795 257/401 |

* cited by examiner

METHOD FOR PRODUCING A MICROELECTRONIC DEVICE

FIELD OF THE INVENTION

The present invention relates to devices for microelectronics and methods for producing same. It relates in particular to semiconductors having high mobilities (for example based on carbon, germanium, alloys of elements in group III-V, or constrained silicon), presented as alternatives to silicon for certain applications in ultimate technological nodes.

TECHNOLOGICAL BACKGROUND

In the field of microelectronics, the constant reduction in the surface area of silicon occupied by the components has up until now made it possible to maintain the race for integration at a rate decreed by Moore's law, which provides that the number of transistors per integrated circuit doubles approximately every 18 to 24 months. However, this race for integration is on the point of coming up against limits of a physical and technological nature that transistors of the metal-oxide-semiconductor (MOS) on solid silicon type will visibly not manage to overcome. Furthermore, architecture on solid silicon will not make it possible to contain, beyond a certain integration threshold, the bidimensional electrostatic forces and certain quantal effects detrimental to the vertical field effect caused by the gate. Current researches in microelectronics are thus exploring novel component architectures, alternative solutions to the conventional MOS transistor. Furthermore, the development of innovative architectures on thin silicon in combination with other so-called "exotic" materials having high mobilities (for example based on carbon, germanium, alloys of elements in group III-V) could make it possible to continue the race towards miniaturisation of components of the CMOS type (the acronym for complementary metal oxide semiconductor).

Devices produced on materials of the semiconductor type other than silicon are usually obtained from epitaxed layers on solid substrates other than silicon (the diameter of which is generally less than or equal to 200 mm). These solid substrates other than silicon have the drawbacks of their cost and their incompatibility in terms of size with equipment developed for the latest generations of silicon components (300 mm, 450 mm in preparation). The use of a solid silicon substrate thus remains the least expensive solution and the most compatible with the known manufacturing methods.

In order to overcome these problems, the method has emerged which consists of obtaining these materials by epitaxial growth on a host silicon substrate of the desired size. However, this approach comes up against the high disparity in lattice parameter between the main materials of interest and silicon. For example, a difference in lattice parameters close to 4% is observed for germanium (Ge) and gallium arsenide (GaAs); this difference is approximately 8% with indium phosphide (InP).

Under these circumstances, obtaining a continuous epitaxial layer (over the entire host substrate), comprising a minimum of crystalline defects, makes it necessary to have recourse to thick intermediate buffer layers, making the approach particularly expensive without being completely effective. This is because there always remains a not insignificant density of dislocations.

By giving up on obtaining a continuous layer, it is possible to achieve lower dislocation densities for heteroepitaxed layers on a silicon substrate. This principle is known by the term "aspect ratio trapping" or "dislocations necking".

Figure 1A:
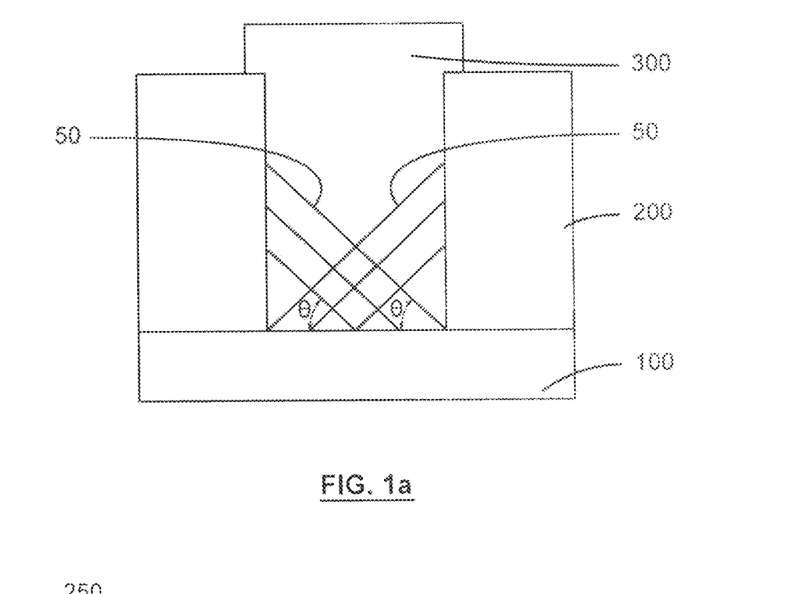
FIG. 1a illustrates a schematic representation of the principle of confinement of the dislocations of a germanium layer formed from a silicon substrate inside a trench based on silicon oxide.

Nevertheless, this approach has several limits. These drawbacks are, for example, illustrated in FIGS. 1a to 1c, coming from the publication by J.-S. Park et al, Applied Physics Letter 90, 052113 (2007). FIG. 1a illustrates a schematic representation of the principle of confinement of dislocations 50 on a layer 300 of germanium formed from a silicon (Si) substrate 100 in a trench 250 formed in a masking layer 200 based on silicon oxide ($SiO_2$). The layer 300 of germanium is grown in the trench 250 formed in a masking layer 200 that covers the silicon substrate 100. By virtue of a minimum aspect ratio, the dislocations 50 are trapped on the flanks and bottom of the layer 300, giving a material better surface quality than the equivalent continuous layer (for the same thickness). As shown in FIG. 1a, the transverse dislocations 50 of the layer 300 of germanium require that the masking layer 200 should have a thickness greater than the width of the trenches 250.

Figure 1B:
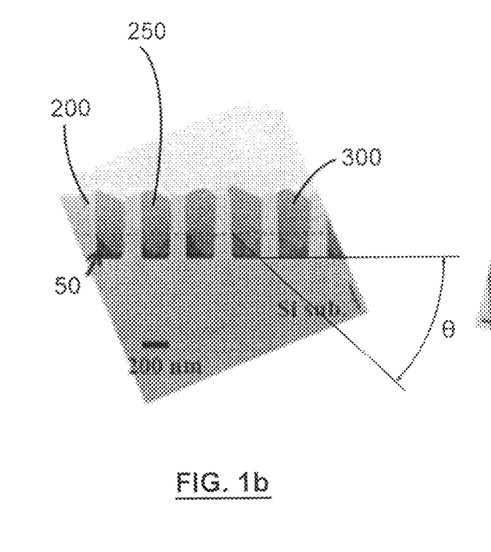
FIG. 1b illustrates a view in cross section, obtained by transmission electron microscopy, of the principle of confinement of the dislocations of a layer of germanium formed from a silicon substrate inside a trench based on silicon oxide.
Figure 1C:
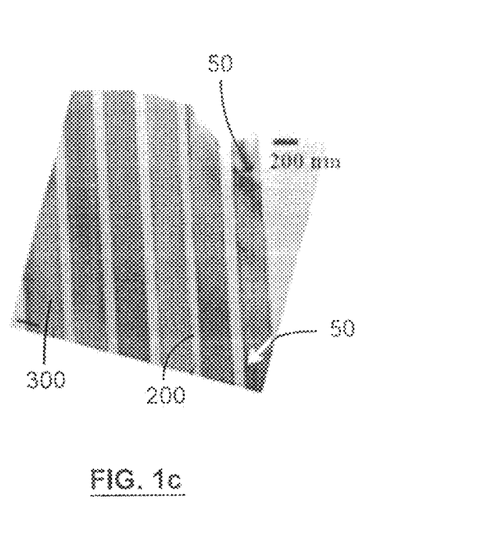
FIG. 1c illustrates a plan view, obtained by transmission electron microscopy, of the principle of confinement of the dislocations of a layer of germanium formed from a silicon substrate inside a trench based on silicon oxide.

Furthermore, one of the major drawbacks is the emergence of dislocations 50 on a surface that is blocked only in the directions with a high aspect ratio, that is to say in a transverse direction to the trenches 250 (see FIG. 1b illustrating a view in cross section obtained by transmission electron microscopy (TEM)) but not in the length (see FIG. 1c illustrating plan view obtained by transmission electron microscopy (TEM). The dislocations 50 are represented by a more accentuated colour contrast on the TEM images. It can thus be seen that the crystalline defects (or dislocations 50) caused by the growth of the layer 300 from the substrate 100 are located in the bottom of the trench 250, that is to say at the interface with the substrate 100, and along the flanks of the masking layer 200. The strong mismatch in lattice parameter between the substrate 100 and the layer 300 generates defects, more commonly referred to as dislocations, at the interface. The deformation of the crystalline structure in the top layer modifies the angle of inclination of the crystalline planes of said top layer with respect to the crystalline planes of the bottom layer, forming an angle θ.

Moreover, it may be advantageous to grow a constrained material (that is to say one where the lattice parameter in a given direction is different from the relaxed lattice parameter). In this case, there exists a limit referred to as the "critical thickness" beyond which the growth of the material may be accompanied by the creation of crystalline defects and the relaxing of the constraint. If it is wished to produce constrained channels of the "fine" type in a material obtained by vertical growth, the height of the "fine" channels is limited by this "critical thickness".

In addition, obtaining dense patterns of the layer 300 of germanium is directly limited by the minimum photorepetition pitch. Moreover, an additional drawback lies in the width of the epitaxed channel formed by the layer 300 of germanium that is directly subjected to the variations imposed by the steps of formation of the trenches 250; said trenches 250 being produced by photolithography and/or etching for example.

One object of the present invention thus consists of proposing a method for producing at least one crystalline structure that limits, or even eliminates, at least some of the problems and drawbacks previously mentioned concerning the known solutions of current techniques. More particularly, the objective of the invention is to form a crystalline structure, for example intended to form a transistor channel, from a material other than that of the substrate, devoid of or having few crystalline defects.

SUMMARY OF THE INVENTION

The invention concerns a method for producing a crystalline layer from a crystalline substrate made from a first material on which a masking layer has previously been deposited; said masking layer comprising at least one trench forming an access to the substrate. Advantageously, the trench has a depth at least equal to a value Hc such that $Hc=K \cdot S \cdot \tan(\theta)$, where K is at least greater than 0.7, S is the width of the trench and $\theta$ is the angle of the dislocations with respect to the plane of the substrate.

The method according to the invention comprises the following steps:
  forming a crystalline buffer layer situated at least partly in the trench in the masking layer, extending from the substrate and forming a projection beyond the masking layer so that an upper part of the lateral flanks of said buffer layer is left uncovered, the formation step comprising a growth of the buffer layer preferably by growth from the crystalline substrate so as to give a crystalline structure to the buffer layer,
  forming a crystalline epitaxial layer by growth from said upper part of the lateral flanks of the buffer layer left uncovered.

According to a non-limitative embodiment, the epitaxial layer is made from a second material different from the material of the buffer layer.

Thus the present invention makes it possible to produce, in a simple and reproducible manner, from a crystalline substrate formed from the first material, at least one crystalline epitaxial layer made from a second material that is, according to an advantageous embodiment, different from the first material of the substrate.

The invention makes it possible to trap the dislocations and other crystalline defects at the lower part of the buffer layer. The upper part of the latter, which forms a projection beyond the masking layer, is thus devoid of dislocations and other crystalline defects on its lateral flanks. This upper part then serves as a basis for the growth of the crystalline epitaxial layer, it also being devoid of dislocations and other crystalline defects that may cause malfunctionings in a microelectronic device.

The invention also makes it possible to form constrained epitaxial layers during the lateral growth phase, the vertical dimension of which exceeds the critical growth thickness, by virtue of the fact that the last growth takes place laterally rather than vertically (the critical thickness being measured laterally rather than vertically).

The crystalline epitaxial layer thus formed is for example intended to form a channel.

The invention thus offers a simple, precise and effective solution for forming crystalline layers in a given material from a crystalline solid substrate made from a different material.

The invention also concerns a microelectronic device comprising a crystalline substrate covered with a masking layer comprising at least one trench forming an access to the substrate, the trench having a depth at least equal to its width, characterised in that it comprises:
  a crystalline buffer layer formed at least partly in the trench and extending from the substrate in order to form a projection with respect of the masking layer;
  a crystalline epitaxial layer formed on at least a part of the lateral flanks of the buffer layer that forms a projection beyond the masking layer.

Thus a device is produced in accordance with a method which, particularly advantageously, is not subject to the limitations encountered on solid substrates, in particular to the choice of the material and the aspect ratio.

Optionally, the material of the epitaxial layer is chosen so as to be able to grow on the material of the buffer layer. Optionally, the material of the buffer layer is chosen according to the orientation of the crystalline planes of the substrate. According to an advantageous embodiment, the material of the buffer layer is different from the material of the epitaxial layer so as to be able to selectively remove the buffer layer vis-à-vis the epitaxial layer.

Optionally, at least some of the epitaxial layers or each of them form a channel of a transistor, for example of the FinFET type, without this being limitative.

According to an embodiment, the epitaxial layer forms two portions extending on either side of the buffer layer, each portion of the epitaxial layer forming a channel of a transistor, preferably of the FinFET type. Thus a portion situated on one side of the buffer layer forms a first channel and a portion situated on the other side of the buffer layer forms a second channel.

According to one embodiment, a channel is formed on only one of the lateral flanks of the buffer layer. Preferably, a channel is formed on each of the lateral flanks of the buffer layer, thus forming a pair of channels from the same buffer layer. Forming pairs of channels affords an advantage in terms of density (twice as many channels). This makes it possible to form vertical structures with fewer limitations in terms of density.

Advantageously, the channels are electrically insulated.

Particularly advantageously, the method according to the present invention makes it possible to produce a device having at least one channel defined by (hetero) epitaxy. Advantageously, the at least one channel forms a thin channel by means of a controlled lateral growth; the line formed by said channel thereby being better controlled in terms of thickness and having less roughness.

The channels obtained may thus have a very reliable thickness, a thickness taken in a plane parallel to the plane in which the substrate mainly lies.

BRIEF INTRODUCTION OF THE FIGURES

Other features, aims and advantages of the present invention will emerge from a reading of the following detailed description with regard to the accompanying drawings given by way of non-limitative examples, on which:

FIGS. 2a to 2f illustrate the formation of a crystalline layer according to a first embodiment of the invention. More precisely:

FIGS. 3a to 3f illustrate the formation of a crystalline layer according to a second embodiment of the invention. More precisely:

The drawings are given by way of examples and are not limitative of the invention. They constitute schematic outline representations intended to facilitate understanding of the invention and are not necessarily to the scale of practical applications. In particular, the relative thicknesses of the various layers are not representative of reality.

In the context of the present invention, the term "on" does not necessarily mean "in contact with". Thus, for example, the formation of a layer on another layer does not necessarily mean that the two layers are directly in contact with each other but means that one of the layers at least partially covers the other while being either directly in contact therewith or being separated therefrom by a film, yet another layer or another element.

DETAILED DESCRIPTION

Before beginning a detailed review of embodiments of the invention, optional features, which may optionally be used in association or alternatively, are stated below.

It is stated first of all that the invention relates to a method for producing a crystalline layer from a crystalline substrate.

Preferentially, the growth of the buffer layer comprises an epitaxial growth from the substrate. Particularly advantageously, the epitaxial growth makes it possible to obtain a layer the material of which is of better crystalline quality, thereby comprising a smaller number of dislocations. Epitaxial growth techniques are preferably chosen from chemical vapour deposition (CVD) techniques or molecular beam epitaxy (MBE); these techniques frequently being used in industry.

According to one alternative, the growth of the buffer layer comprises a deposition of said layer followed by a crystallisation annealing. For this type of deposition, chemical vapour deposition can advantageously be used.

Generally, the crystalline buffer layer is formed by growth from the seed of the crystalline substrate.

Thus said step of forming the buffer layer comprises a growth of the buffer layer using as the seed the seed of the crystalline substrate. The use of the seed of crystallised substrate makes it possible to give to the buffer layer a crystalline structure that may be identical to or different from that of the substrate.

Advantageously, the masking layer, in particular its material and structure, is chosen so as to prevent growth of the epitaxial layer from the masking layer. This advantageously allows selective growth of the various layers.

According to one embodiment, the buffer layer is formed so as to leave the top face of the buffer layer uncovered, in addition to said upper part of the lateral flanks of the buffer layer and, prior to the formation of the epitaxial layer, a protective layer is formed on said top face of the buffer layer so as to leave uncovered only said upper part of the lateral flanks of the buffer layer left uncovered. Advantageously, the protective layer allows selective growth only on the lateral flanks of the buffer layer. Thus the protective layer prevents an epitaxial growth taking place from the top of the buffer layer. This epitaxial growth thus takes place only laterally from the flanks of the buffer layer.

Preferentially, the protective layer, in particular its material and structure, is chosen so as to prevent growth of the epitaxial layer from the protective layer.

Particularly advantageously, the formation of the epitaxial layer comprises an epitaxial growth from the upper part of the lateral flanks of the buffer layer left uncovered. The epitaxial growth advantageously makes it possible to form a layer of good crystalline quality having a low density of dislocations.

According to one embodiment, the formation of the epitaxial layer comprises an anisotropic growth directed perpendicular to the lateral flanks of the buffer layer left uncovered. Advantageously, this anisotropic growth makes it possible to form narrow channels having a low density of dislocations and other crystalline defects.

According to another embodiment, the formation of the epitaxial layer comprises a deposition of amorphous material followed by a step of crystallisation of said material. Advantageously, this embodiment is used for forming epitaxial layers comprising only elements in column IV of the periodic table of elements optionally in an alloy (for example carbon, silicon, germanium or tin). Optionally, the crystallisation step will be followed by a step of removing a residual amorphous of polycrystalline region, for example carried out by anisotropic etching.

According to one embodiment, the formation of the buffer layer forming a projection beyond the masking layer comprises, after the growth of the buffer layer from the substrate, a step of removing part of the masking layer so as to uncover said upper part of the lateral flanks of the buffer layer.

According to one embodiment, the growth of the buffer layer from the substrate is effected so that the top of the buffer layer does not form a protection beyond the masking layer before the step of removing a part of the masking layer and forms a protection beyond the masking layer after the step of removing part of the masking layer.

According to one embodiment, the step of removing part of the masking layer is performed by etching. Prior to the step of removing part of the masking layer, a protective layer is formed on the top face of the buffer layer and the etching of the masking layer etches the masking layer selectively with respect to the protective layer and the buffer layer.

According to one embodiment, the protective layer is preserved during the formation of the epitaxial layer.

According to one embodiment, the masking layer is formed in a single layer.

According to one embodiment, the masking layer (200) is formed by a stack of layers.

According to one embodiment, the masking layer comprises a stack of layers wherein the materials differ from one layer to another and are configured so as to be removed selectively with respect to one another.

According to one embodiment, the masking layer comprises a first layer forming a stop layer surmounted by at least one second layer. The step of removing part of the masking layer is performed by etching the second layer and the etching of the second layer takes place with stoppage on the first layer.

According to one embodiment, the epitaxial growth of the buffer layer depends on the orientation of the crystalline planes of the substrate.

According to one embodiment, the etching kinetics of the second layer is at least twice as great as the etching kinetics of the first layer. Thus the first layer forms a stop layer for the etching of the second layer.

According to one embodiment, the step of removing part of the masking layer is performed by etching and the step of removing part of the masking layer is formed by controlling the etching time.

According to one embodiment, the growth of the buffer layer from the substrate is continued until the buffer layer forms a projection beyond the masking layer.

According to one embodiment, the formation of a protective layer on said top face of the buffer layer comprises:
  deposition of a protective layer on the device;
  removal of the entire protective layer on the lateral flanks of the buffer layer while preserving at least part of the protective layer on the masking layer and on said top face of the buffer layer;
  removal of the protective layer on the masking layer leaving in place the protective layer on said top face of the buffer layer.

According to one embodiment, the buffer layer is made from a material identical to that of the epitaxial layer.

According to one embodiment, the buffer layer is made from a material different from that of the epitaxial layer.

According to one embodiment, the material of the buffer layer (300) and the material of the epitaxial layer have a misfit in lattice parameter of less than 2%.

According to one embodiment, the buffer layer is made from a material different from that of the substrate.

According to one embodiment, the material of the buffer layer and the material of the substrate have a misfit in lattice parameter of less than 10%.

According to one embodiment, the electrically insulating interface layer is deposited between the substrate and the masking layer.

According to one embodiment, the substrate is made from silicon or a silicon alloy and another material and the material of the buffer layer is a semiconductor material, preferably taken from: a germanium-silicon (Si—Ge) alloy, gallium arsenide (GaAs), germanium (Ge), indium-gallium arsenide (InGaAs), indium phosphide (InP), gallium nitride (GaN), aluminium nitride (AlN) or an alloy of these materials.

According to one embodiment, the substrate is made from silicon or a silicon alloy and another material and the material of the epitaxial layer is a semiconductor material, preferably taken from: a germanium-silicon (Si—Ge) alloy, gallium arsenide (GaAs), germanium (Ge), indium-gallium arsenide (InGaAs), indium phosphide (InP), gallium nitride (GaN), aluminium nitride (AlN) or an alloy of these materials.

According to one embodiment, the materials of the buffer layer and of the epitaxial layer are chosen from the following combinations: an alloy of germanium-silicon (Si—Ge) with silicon (Si), an alloy of germanium-silicon-tin (Si—Ge—Sn) with an alloy of germanium silicon (Si—Ge), of gallium arsenide (GaAs) with germanium (Ge), of indium-gallium arsenide (InGaAs) with indium phosphide (InP), or of gallium nitride (GaN) with aluminium nitride (AlN).

According to one embodiment, the width of each of the epitaxial layers formed on either side of the buffer layer is between 5 nm and 150 nm, the width being measured in a direction perpendicular to the lateral flanks.

According to one embodiment, the masking layer electrically insulates the epitaxial layer from the substrate.

According to one embodiment, the step of formation of the epitaxial layer is reiterated so that the epitaxial layer is formed from the stack of layers having different or identical materials. Advantageously, this sequence makes it possible for example to obtain a channel and a buffer layer (intermediate layer between the channel and the gate insulator) in the same growth step.

The trench has a depth at least equal to a value Hc such that $Hc=K \cdot S \cdot \tan(\theta)$ where K is at least greater than 0.7, S is the width of the trench and $\theta$ is the angle of the dislocations with respect to the plane of the substrate.

According to one embodiment, K is greater than 0.8 and preferably greater than or equal to 1. Advantageously, K=1. This makes it possible to effectively confine the dislocations in the trench.

When a top layer is formed, preferably by growth, from a bottom layer; said bottom and top layers not having the same lattice parameter, the high disagreement in lattice parameter between the layers causes defects, more commonly referred to as interface dislocations. The deformation of the crystalline structure in the top layer modifies the angle of inclination of the crystalline planes of said top layer with respect to the crystalline planes of the bottom layer. Thus dislocation angle $\theta$ means the angle of inclination of the crystallising planes of the top layer with respect to the bottom layer. In general, the dislocation angle $\theta$ may for example be determined by transmission electron microscopy.

The dislocation angle $\theta$ is advantageously between 30° and 90° and preferentially between 50° and 60°. According to one embodiment, the value Hc is between 0.5 S and 2.5 S, preferably between S and 2.5 S. Preferably, the value Hc is around 2 S.

Advantageously, the aspect ratio is around 2. According to a preferred embodiment, the trench has a depth greater than twice and preferably greater than three times the width of the trench.

Particularly advantageously, each epitaxial layer forms a channel of a transistor.

FIGS. 2a to 2f detail the steps of the method of the invention according to a first embodiment.

Figure 2A:
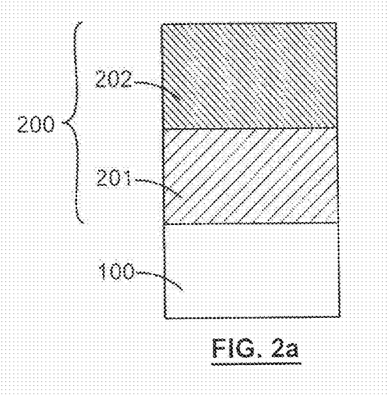
FIG. 2a illustrates the formation of a masking layer on the substrate; said masking layer comprising a plurality of layers.

FIG. 2a illustrates the formation of the masking layer 200 on a substrate 100. The manufacturing method is implemented using a substrate 100, made from a first material, preferably based on semiconductor. Advantageously, the cut of the substrate 100, that is to say the orientation of the surface of this semiconductor crystal, depends on the application envisaged. According to non-limitative example embodiments of the invention, it is possible to choose a substrate 100, preferably made with silicon, where the surface of the crystal is oriented either along the crystalline planes <100>, or along the crystalline planes <100> but offset by a few degrees, or along the crystalline planes <111>.

The method begins with the formation of a masking layer 200 on the substrate 100. The masking layer 200 is preferably chosen so as to be electrically insulating. According to a non-limitative embodiment, the masking layer 200 comprises a stack of layers 201, 202. Advantageously, the layers 201, 202 are formed from materials having different etching selectivities. The materials of the layers 201, 202 are preferably chosen so that it is possible to selectively etch a second layer 202 with respect to a first layer 201. According to an example embodiment, the selectivity of the etching between these first and second layers 201 and 202 may be 4 for 1, so that the first layer 201 is consumed at a quarter of the rate of the second layer 202. Alternatively, the masking layer 200 is formed by a single layer.

The thickness of the masking layer 200 (or of the stack of layers 201, 202) is typically between 200 nanometers (nm) and 1 micron ($\mu m=10^{-6}$ meters). The thickness is measured in a direction perpendicular to the main surface of the substrate 100.

Figure 2B:
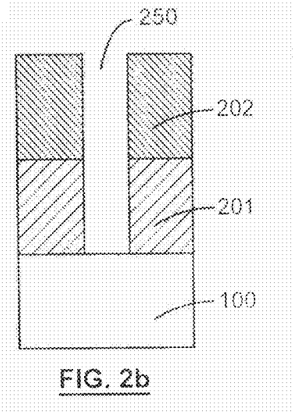
FIG. 2b illustrates the formation of a trench in the masking layer so as to form an access opening in the substrate.

The surface of the substrate 100 lies mainly in a plane parallel to the plane ZX of the orthogonal reference frame illustrated in FIG. 2b. Thus, in the present patent application, the thicknesses are generally taken along the direction Y perpendicular to the main face of the substrate on which the various layers rest. In the figures, the thickness is taken vertically.

According to one example embodiment, a supplementary layer (not illustrated) is inserted between the substrate 100 and the masking layer 200 (or the first layer 201). This supplementary layer is configured so as to serve as a stop layer during any etching of the masking layer 200 (or the first layer 201) and thus to facilitate said etching, without causing any damage to the substrate 100.

FIG. 2b illustrates the formation of trenches 250 in the masking layer 200 (that is to say the stack of layers 201, 202) so as to reach the substrate 100. According to one embodiment, the trenches 250 are obtained by selective etching of the masking layer 200 (or of the stack of layers 201, 202). The etching is preferentially anisotropic. The etching is carried out so as to form trenches 250, the walls of which, extending in a direction perpendicular to the surface of the substrate 100 (direction Y), comprise the lateral flanks of the masking layer 200 or the lateral flanks of the first and second layers 201, 202, depending on the embodiment chosen. These trenches 250 have an aspect ratio advantageously greater than 1.

Aspect ratio means the ratio between the depth and width of the trench 250. The depth of the trench 250 extends in a direction perpendicular to the surface of the substrate 100. It is taken in the direction Y. The width of the trench 250 is the distance separating the opposite walls of the trench 250 and lies in a plane parallel to the surface of the substrate 100. It is taken in the direction X.

Advantageously, the depth of the trench 250 corresponds to the thickness of the masking layer 200. The depth of the trench 250 is typically between 50 nm and 1 µm. The thickness of the trench 250 is preferably between 20 and 400 nm. Particularly advantageously, the depth of the trench 250 is at least equal to the width of the trench 250.

Figure 2C:
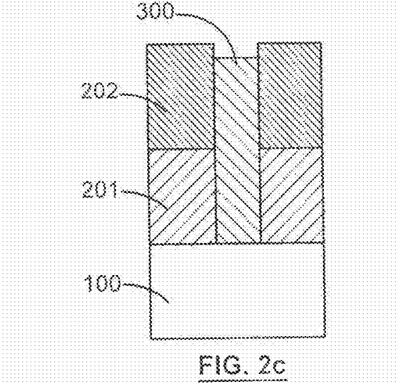
FIG. 2c illustrates the formation of a buffer layer in the trench in the masking layer.

FIG. 2c illustrates the step of forming the buffer layer 300 in the trench 250 formed in the masking layer 200. Preferentially, the formation of the buffer layer 300 comprises an epitaxial growth of said buffer layer 300, from the substrate 100. Epitaxial growth means the formation of a crystalline layer with the same orientation in direct contact with the seed substrate 100. The formation may advantageously be in the form of a molecular beam epitaxy (MBE) or chemical vapour deposition (CVD) growth. It could also be obtained by a succession of steps involving the deposition of an amorphous layer, its crystallisation in contact with the seed substrate 100 and removal of the undesirable deposited material. If the material of the buffer layer 300 has a lattice parameter different from that of the substrate 100, then it preferably has a crystallised structure and a lattice parameter compatible with the crystalline properties of the surface of the substrate 100. As for the materials of the stack of layers 201, 202, they are advantageously compatible with the conditions of formation of the material of the buffer layer 300.

According to an example configuration, for the purpose of growing a silicon-germanium (SiGe) alloy for the buffer layer 300, use will preferentially be made of a surface of the substrate 100 oriented along the crystalline planes <100>. To grow the gallium arsenide (GaAs) for the buffer layer 300, use will preferably be made of a surface of the substrate 100 oriented along the crystalline plane <100>, but slightly offset (by an angle of less than 10°). In another case, for a growth of gallium nitride (GaN) for the buffer layer 300, use will preferentially be made of a surface of the substrate 100 oriented along the crystalline planes <111>.

Advantageously, the width of the trench 250 and the thickness of the masking layer 200 comprising, according to one embodiment, a first layer 201 and a second layer 202, are chosen so that the crystalline defects (that is to say the dislocations 50 observed in FIGS. 1a to 1c) of the buffer layer 300 are confined on the lateral flanks of the first masking layer 201 without reaching the lateral flanks of the insulating second layer 202.

According to non-limitative example embodiments of the invention, the material of the masking layer 200 (or of the first layer 201) can be chosen from silicon oxide ($SiO_2$) or silicon nitride ($Si_3N_4$) in the case where the buffer layer 300 comprises the material of the type such as gallium arsenide (GaAs), the silicon-germanium-tin alloy ($Si_xGe_{1-X-Y}Sn_Y$, where x and y are the relative proportions of silicon and tin in the material, with x+y between 0 and 1) or indium phosphide (InP). In the case of a growth of gallium nitride (GaN), silicon nitride ($Si_3N_4$) can be used as the material for the masking layer 200.

At the end of the growth, the buffer layer 300 is partly confined in the trench 250; its lateral edges being framed by the walls of the trench 250, its bottom face being in contact with the substrate 100.

According to the embodiment illustrated, the growth of the buffer layer is stopped before the height of the buffer layer (taken in the direction Y) exceeds the depth of the trench 250. The top face of the buffer layer, representing the top of this layer 300, is not covered. The top and bottom faces of the buffer layer 300 lie on a plane substantially parallel to the surface of the substrate 100.

Figure 2D:
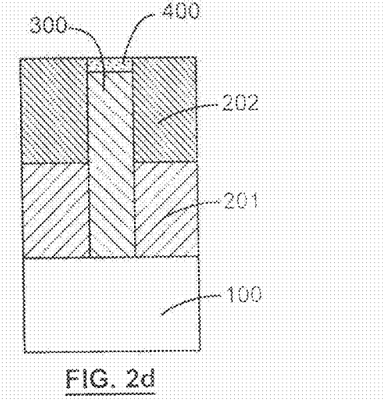
FIG. 2d illustrates the formation of a protective layer at least on the top surface of the buffer layer.

FIG. 2d illustrates the formation of a protective layer 400 on at least the top face of the buffer layer 300. According to a preferential but not limitative embodiment, the protective layer 400 is produced in a "solid sheet", that is to say over the entire surface. This step will preferentially be followed by a partial removal of the protective layer 400 so as to leave the protective layer 400 in place only on the top face of the buffer layer 300, as illustrated in FIG. 2d.

This partial removal comprises, for example, smoothing carried out by chemical and mechanical polishing. The protective layer 400 can be formed by a deposition technique or by a growth technique. According to another embodiment, the protective layer 400 is formed solely on the top face of the buffer layer 300 using photolithography and etching techniques for example. The material of the protective layer 400 is advantageously chosen so that it can slow down or even block any epitaxial growth on the top face of the buffer layer 300. In addition, this material is also chosen so as to resist the selective removal of the second layer 202 (that is to say the top layer of the stack of the masking layer 200). The material of the protective layer 400 is for example aluminium oxide ($Al_2O_3$) in the case where the material of the buffer layer 300 is chosen from silicon oxide ($SiO_2$) or silicon nitride ($Si_3N_4$).

Figure 2E:
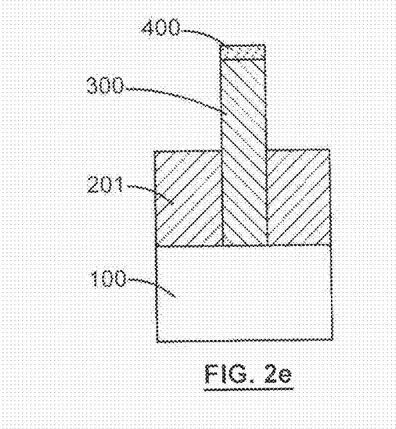
FIG. 2e illustrates the partial selective removal of the masking layer so that the buffer layer projects beyond the masking layer, leaving at least the top face and part of the lateral flanks of the buffer layer uncovered.

FIG. 2e illustrates the selective partial removal of the masking layer 200, that is to say the selective removal of the second masking layer 202. According to a particularly advantageous embodiment, the removal of the second layer 202 comprises an etching that may be isotropic or anisotropic and can be carried out by means of an aqueous solution of hydrofluoric acid in the case where the layer 200 is produced from silicon dioxide ($SiO_2$) and the layer 300 is a crystalline semiconductor so that the removal takes place in a direction parallel to the lateral flanks of the buffer layer 300; said lateral flanks thereby being only slightly attacked during this step of removal of the second insulating layer 202.

In the case where the method requires the selective removal of the protective layer 400 relative to the insulating layers 200, 202: if the protective layer 400 comprises alumina ($Al_2O_3$) and the masking layers 200, 202 of silicon oxide ($SiO_2$) and/or silicon nitride ($Si_3N_4$), then the etching solution could be formed from a mixture comprising sulfuric acid ($H_2SO_4$) and hydrogen peroxide ($H_2O_2$) or potassium peroxide (KOH). Where the method requires the selective removal of the second masking layer 202 relative to the protective layer 400 and to the masking layer 201, if the second masking layer 202 comprises silicon nitride ($Si_3N_4$), the protective layer 400 of alumina ($Al_2O_3$) and the first masking layer 201 silicon oxide ($SiO_2$), then the etching solution could be formed from a mixture comprising trifluoromethane ($CHF_3$) and dioxygen ($O_2$). In another case where the second insulating layer 202 comprises silicon oxide ($SiO_2$), the protective layer alumina ($Al_2O_3$) and the masking layer 201 silicon nitride ($Si_3N_4$), then the solution etching the masking layer 202 could be formed from hydrofluoric acid (HF).

At the end of this selective partial removal of the masking layer 200, the buffer layer 300 advantageously projects beyond the masking layer 200. The buffer layer 300 thus leaves at least a upper part of its lateral flanks uncovered; said lateral flanks extending in a plane orthogonal to the surface of the substrate 100 (and therefore in a plane YZ). Preferentially, the height (measured in a direction Y orthogonal to the surface of the substrate) of the part of the buffer layer 300 projecting beyond the masking layer 200 corresponds to the thickness of the second masking layer 202 removed during the step of removal of said layer. Advantageously, the first masking layer 201 serves as a stop layer when the second masking layer 202 is removed.

Figure 2F:
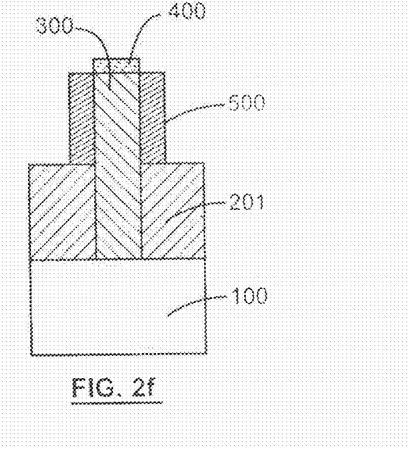
FIG. 2f illustrates the formation of the epitaxial layer on at least the part of the lateral flanks of the buffer layer left uncovered.

FIG. 2f illustrates the step of forming the epitaxial layer 500 on the lateral flanks of the buffer layer 300, flanks left uncovered during the previous step. Advantageously, the formation of the epitaxial layer 500 comprises a lateral growth carried out by MBE or CVD, in a direction perpendicular to the flanks of the buffer layer 300 (and therefore in the direction X), of the epitaxial layer 500 from the lateral flanks of the buffer layer 300. According to one embodiment, the growth is epitaxial in vapour phase (of the CVD (chemical vapour deposition) type or VPE (vapour phase epitaxy) type) or by molecular beam (MBE).

In the case of a heteroepitaxy, the epitaxed layer 500 may be a lattice match or lattice mismatch, for example a disagreement of less than or equal to 1%, with the layer from which it was formed, that is to say, in the present case, the buffer layer 300. The growth advantageously takes place monolayer by monolayer. In the case of heteroepitaxy, the lattice mismatch or misfit, that is to say the difference between the lattice parameters of the buffer layer 300 and those of the epitaxial layer 500, may give rise to defects in the structure of the latter if its thickness is such that the elastic energy that it contains (because of its deformation) is greater than the energy enabling a crystalline defect to be created. Initially, the atoms deposited adapt to the crystalline structure of the buffer layer 300. However, when the thickness of the epitaxial layer 500 formed increases, the chemical properties of its elements prevail over those of the buffer layer 300: the atoms choose the structure of the pure material, which could deform the crystalline structure of the epitaxed layer 500 and cause the creation of dislocations 50. In order to avoid such inconveniences, the material of the epitaxial layer 500 advantageously has a crystallising structure, a lattice parameter and a thickness making it suitable for growth without defects on the buffer layer 300.

Following this epitaxial growth, the epitaxial layer 500 has a thickness, measured in a direction perpendicular to the flanks of the buffer layer 300 (and therefore in the direction X) of between 5 and 150 nm, preferably around 10 nm.

The epitaxial layer 500 is formed for the second material, preferably being able to be different from the first material of the substrate 100. According to non-limitative examples, the materials of the buffer layer 300 and of the epitaxial layer 500 may be chosen from the following (interchangeable) combinations, having materials where the lattice parameters are similar: an alloy of germanium-silicon (Si—Ge) with silicon (Si), an alloy of germanium-silicon-tin (Si—Ge—Sn) with an alloy of germanium silicon (Si—Ge), of gallium arsenide (GaAs) with germanium (Ge), of indium-gallium arsenide (InGaAs) with indium phosphide (InP), or of gallium nitride (GaN) with aluminium nitride (AlN).

Preferentially, the material of the remaining masking layer 200, 201 is compatible with the selective growth of the material of the epitaxial layer 500 with respect to the material of the buffer layer 300. The material of the masking layer 200, 201 is advantageously conformed so as to withstand the chemical attacks implemented during the production of the device.

Advantageously, the previously described embodiment therefore does not depend on the ratio between lateral and vertical growth speed of the buffer layer 300. The epitaxy of this buffer layer 300 is, in fact, entirely confined along the flanks of a trench 250 formed in the masking layer 200.

As indicated previously, the crystalline defects are trapped in a bottom part of the buffer layer 30, that is to say within a part of the buffer layer that does not form a projection beyond the masking layer 200. On the other hand, an upper part of the buffer layer 300, further away from the substrate 100 than the lower portion, will for its part be free or practically free from crystalline defects and dislocations. This upper part extends partly at least beyond the masking layer 200 and from the bottom part. As it is on the basis of this upper part that the epitaxial growth of the layer 500 is effected, it is also free or practically free from crystalline defects and dislocations.

Although the embodiment illustrated provides a masking layer 200 formed by two layers 201 and 202, a higher number of layers can be provided. Alternatively, it would be possible to provide a masking layer 200 formed from a single layer. In this case, the etching of the masking layer 200 during the partial removal in order to allow the buffer layer 300 to be passed is stopped by controlling the etching time.

FIGS. 3a to 3f illustrate another alternative of the method for implementing the device according to the invention. This other approach is based on a particular growth of the buffer layer 300 in trenches 250 according to conditions that make it possible to obtain a vertical growth speed (that is to say on a plane orthogonal to the surface of the substrate 100, and therefore in the direction Y) greater than the lateral growth speed (that is to say on a plane parallel to the surface of the substrate 100 and therefore in the direction X). Under these circumstances, it is possible to grow a thickness (in a direction orthogonal to the surface of the substrate 100, and therefore in the direction Y) of the buffer layer 100 greater than the depth (in a direction orthogonal to the surface of the substrate 100 and therefore in the direction Y) of the trench 250, for example in order to have a structure of the fin type.

Figure 3A:
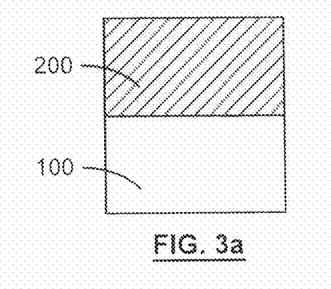
FIG. 3a illustrates the formation of a masking layer on a substrate.

FIG. 3a illustrates the formation of the masking layer 200 on the substrate 100. The function of this masking layer 200 is advantageously to localise the formation of the buffer layer 300 as well as to confine the transverse crystalline defects of the buffer layer 300.

Figure 3B:
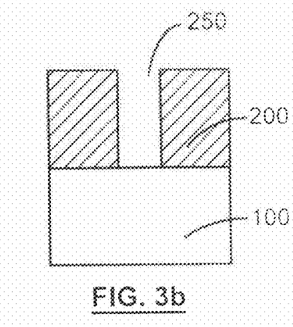
FIG. 3b illustrates the formation of a trench in the masking layer so as to form an access opening in the substrate.

FIG. 3b illustrates the formation of trenches 250 in the masking layer 200. Forming the trenches 250 requires having recourse, for example, to photolithography and etching steps.

The width of the trenches 250 is related to the thickness of the masking layer 200 in that the ratio of these two dimensions (that is to say the aspect ratio) must be sufficient to guarantee confinement of the transverse crystalline defects of the buffer layer 300 along the flanks of the masking layer 200. It has been observed that the growth of the buffer layer 300 of germanium in the trenches 250 formed in the masking layer 200 of silicon oxide ($SO_2$); is implemented for aspect ratios greater than 1. Thus the thickness (measured in the direction Y) of the masking layer 200 is at least equal to the width (measured in the direction X) of the trenches 250.

Figure 3C:
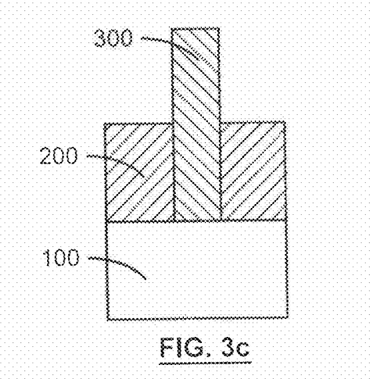
FIG. 3c illustrates the formation of a buffer layer in the trench in the masking layer.

FIG. 3c illustrates the formation of the buffer layer 300. Preferably, the formation of this layer comprises an epitaxial growth (of the CVD or MBE type) of said layer from the substrate 100 anisotropically. In this case, the growth of the buffer layer 300 on a plane orthogonal to the surface of the substrate 100 is advantageously quicker than the growth of said layer on a plane parallel to the surface of the substrate 100. Advantageously, the anisotropy of the growth on a plane orthogonal to the surface of the substrate 100 guarantees the formation of the epitaxial layer in the form of a fin. In this embodiment, the substrate 100 is chosen so that the crystalline planes favour the formation (or more precisely the growth) of the buffer layer 300.

In this particular embodiment, it is no longer necessary to use a stack of layers 201, 202 for the masking layer 200 since the growth of the buffer layer 300 advantageously takes place anisotropically; the horizontal growth on a plane parallel to the surface of the substrate 100 being dominant with respect to the vertical growth (on a plane orthogonal to the surface of the substrate 100).

The buffer layer 300 is formed so that the buffer layer 300 advantageously forms a projection beyond the masking layer 200, leaving at least its top face uncovered, lying on a plane parallel to the surface of the substrate 100, and a part of its lateral flanks; said lateral flanks lying on a plane orthogonal to the surface of the substrate 100.

Advantageously, the height (measured in a direction orthogonal to the surface of the substrate) of the part of the buffer layer 300 projecting beyond the masking layer 200 is around 10 to 200 nanometers and depends on the growth technique used for forming the buffer layer 300.

Figure 3D:
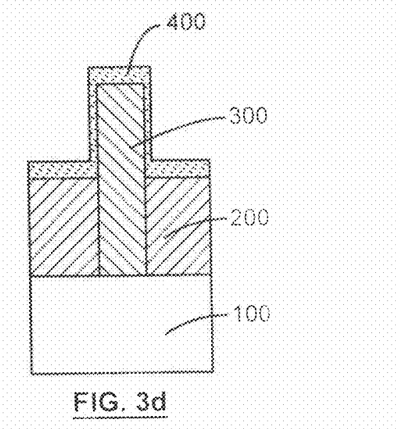
FIG. 3d illustrates the formation of a protective layer on the layers.

FIG. 3d illustrates the formation of a protective layer 400 on at least the top face of the buffer layer 300.

The material of the protective layer 400 is preferentially electrically insulating. Preferably, the formation of a protective layer 400 comprises a solid-sheet deposition followed by a removal of the protective layer 400 that is selective with respect to the material of the buffer layer 300 and to the material of the masking layer 200. The removal may be done using the same means as those stated in FIG. 2e. Preferably, the formation of the protective layer 400 must be non-uniform over the surface. In particular, the thickness of the protective layer 400 formed on the lateral flanks of the buffer layer 300 is less than the thickness of said layer on the top face of the buffer layer and on the masking layer 200. According to a preferential embodiment, the protective layer 400 is performed by sputtering.

Figure 3E:
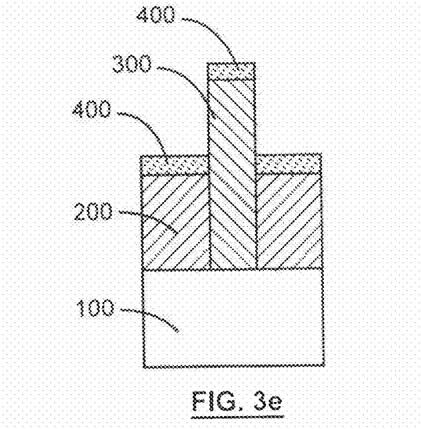
FIG. 3e illustrates the partial removal of the protective layer so as to uncover the lateral flanks of the buffer layer.

FIG. 3e illustrates the partial removal of the protective layer 400 so as to expose the lateral flanks of the buffer layer 300. Preferably, this partial removal comprises etching, for example carried out by means of an aqueous solution of hydrofluoric acid in the case of the removal of a layer 400 of silicon oxide. This etching is preferentially carried out isotropically and in a way that is limited in time so as to remove the entire thickness of the protective layer 400 on the flanks of the buffer layer 400 and to preserve it on the top of the latter.

Figure 3F:
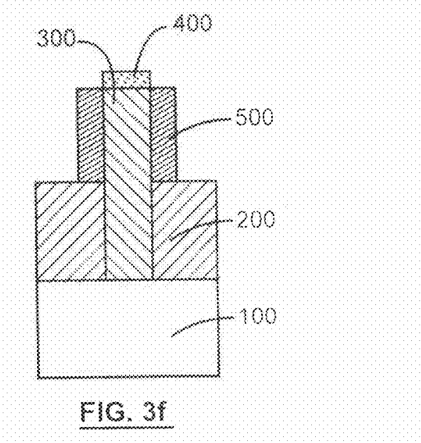
FIG. 3f illustrates the formation of the epitaxial layer on at least the part of the lateral flanks of the buffer layer left uncovered.

FIG. 3f illustrates the formation of the epitaxial layer 500 from the buffer layer 300. Advantageously, the epitaxial layer 500 is produced from an epitaxial growth, laterally on the lateral flanks of the buffer layer 300; a similar technique to that described in FIG. 2f.

According to non-limitative examples, the materials of the buffer layer 300 and of the epitaxial layer 500 may be chosen from the following (interchangeable) combinations: an alloy of germanium-silicon (Si—Ge) with silicon (Si), of gallium arsenide (GaAs) with germanium (Ge), of indium-gallium arsenide (InGaAs) with indium phosphide (InP), or of gallium nitride (GaN) with aluminium nitride (AlN).

The materials of the buffer layer 300 and of the epitaxial layer 500 may have identical crystalline structures but different lattice parameters. In this case, the material of the epitaxial layer 500 will be constrained if its thickness is limited in order to prevent any elastic relaxation.

The epitaxial layer 500 produced according to the method of the invention forms for example a channel the width of which, extending in a direction orthogonal to the lateral flanks of the buffer layer 300, corresponds to the thickness of the epitaxial layer and the depth of which corresponds to the height of the buffer layer 300 forming a projection beyond the masking layer 200, 201. Particularly advantageously, the channel is formed from a second material, preferably different from the first material of the substrate 100.

According to a particular embodiment, the lateral growth of the epitaxial layer 500 may be followed by a lateral growth of a buffer layer 300 followed by another lateral growth of the epitaxial layer 500, so as to obtain several pairs of channels of channels of the epitaxial layer 500; preferably, the channels will be formed from different materials.

The present invention advantageously makes it possible to produce layers of crystalline materials without dislocations 50 and for example constrained channels without dislocations. For constrained silicon channels, for example, it will be possible to use silicon-germanium (SiGe) for the buffer layer 300 in order to grow an epitaxial layer 500 based on silicon under tension. In another example, in order to obtain constrained silicon channels, it will be possible to use for example silicon carbide (SiC) for the buffer layer 300 in order to grow an epitaxial layer 500 based on silicon under compression. According to another embodiment, in order to obtain channels of silicon-germanium (SiGe) under compression, it will be possible to use, for the buffer layer 300, relaxed germanium.

Advantageously, the material of the buffer layer 300 may be chosen with a large gap, that is to say with a wide forbidden band (in other words preferably around 1.5 eV more than the gap of the material of the layer 500), so as to confine the conduction of the material of the epitaxial layer 500 without current circulation in the material of the buffer layer 300.

According to a preferential embodiment, the materials of the buffer layer 300 and of the epitaxial layer 500 may be chosen so as to facilitate the production of contact electrodes.

Figure 4A:
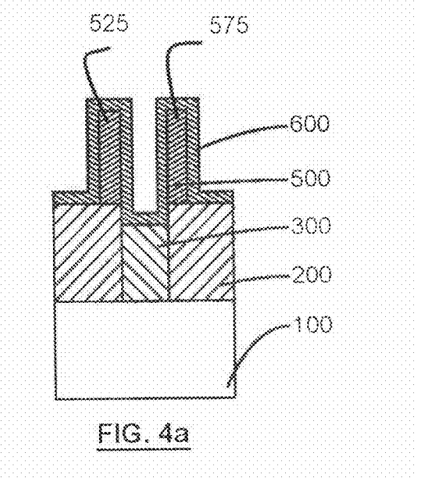
FIGS. 4a and 4b illustrate respectively a front view and a profile view of a device comprising a FinFET transistor produced from an epitaxial layer formed according to the method of the invention.
Figure 4B:
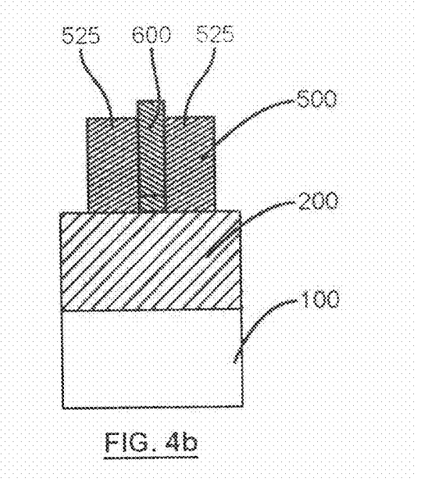

FIGS. 4a and 4b illustrate a preferred embodiment for forming a device comprising a FinFET transistor, produced from a layer formed according to the method of the invention. FinFET is the acronym of "fin-shaped field effect transistor", fin being used here in relation to the form given by the architecture of the transistors to the drain and source, which then resemble ailerons or fins. This term designates transistors that are also referred to as "3D transistors" which, unlike conventional transistors, develop in three dimensions. These transistors are composed of three elements: the drain, the source and the gate, with a channel that connects the source and drain. FinFET etching of transistors advantageously reduces by approximately 50% (depending on the methods) the current leakages that have become problematic as the etching of the processors has been refined. Another advantage of FinFET transistors is they occupy a smaller surface area since they are also constructed in height, which enables them finally to switch more rapidly.

In order to produce FinFET transistors from the method according to the invention, after the formation of the epitaxial layer 500 from the upper part of the lateral flanks of the buffer layer 300, the partial removal is proceeded with of said buffer layer 300 of the region in contact with the channels 525, 575 preferably formed on either side of the buffer layer 300, by the epitaxial layer 500, as illustrated in FIG. 4a. The partial removal of the buffer layer 300 can be done by etching, preferably anisotropic, of the buffer layer 300. Once the etching has been carried out, a layer is deposited intended to form a gate 600 on part of the fins of the epitaxial layer 500. Advantageously, the fin at least partly forms a channel 525, 575. The gate 600 is advantageously configured so as to contact each of the fins or channels 525, 575 of the epitaxial layer 500. According to another embodiment, a first gate (referred to as a "postiche" gate) and subsequently the buffer layer 300 is removed in a method of the "gate last" type.

After the formation of the layer of the gate 300, contacts intended to form a source and drain at said epitaxial layer 500, as illustrated in FIG. 4b, are produced on some of the fins and on at least one channel 525, 575 of the epitaxial layer 500 not covered by the gate 300.

Optionally, at least some or each epitaxial layer 500 forms at least one channel 525, 575 of a transistor, preferably of the FinFET type. According to one embodiment, a channel 525, 575 is formed on only one of the lateral flanks of the buffer layer. Preferably, a first channel 525 is formed on a first lateral flank of the buffer layer 300 and a second channel 575 on another lateral flank of the buffer layer 300, thus forming a pair of channels 525, 575 from the same buffer layer 300. Forming pairs of channels 525, 575 affords an advantage in terms of density (twice as many channels 525, 575 formed). This makes it possible to form vertical structures with few limitations in terms of density. Advantageously, the channels 525, 575 are electrically insulated.

Particularly advantageously, the method according to the present invention makes it possible to produce a device having at least one channel 525, 575 defined by (hereto) epitaxy. Advantageously, the at least one channel 525, 575 forms a thin channel 525, 575 by means of a controlled lateral growth; the line formed by said channel 525, 575 thereby being better controlled for thickness and having less roughness.

According to one embodiment, the buffer layer 300 may comprise a stop layer so that removal of the buffer layer 300 can be stopped by said stop layer. Preferentially, the stop layer comprises a material different from the one used for the buffer layer 300.

The protective layer 400 formed on the top surface of the buffer layer 300 in order to prevent any growth of the epitaxial layer 500 on the top face can be removed locally for the purpose of forming a bridge between the epitaxed regions of the epitaxial layer 500 formed on either side of the buffer layer 300. This may be advantageous in order to produce a connection between two conductive or semiconductive fins separated by an electrically insulating buffer layer 300.

The epitaxial layer 500 may comprise a stack of layers, for example in the case of a type III-V channel epitaxial layer requiring an epitaxial capping layer before the deposition of the gate stack. This embodiment distances the charge carriers that travel through the epitaxial layer 500 of the surface of the gate insulator, and also preserves their mobility.

Advantageously, it is possible to combine a multitude of materials for the buffer layer 300 and epitaxial layer 500 so as to offer simultaneously diverse characteristics on the same substrate 100. In particular, according to one embodiment, n and p channel devices are produced on the same substrate 100. For example, the material of the epitaxial layer 500 may be chosen from silicon or indium-gallium arsenide (InGaAs) (constrained or not) in order to form the n-type channel. According to another example configuration, by varying the composition of the silicon-germanium (SiGe), devices are produced wherein the threshold voltage differs.

The present invention also makes it possible to produce, on the same substrate 100, devices with different natures such as for example field effect transistors of the FinFET type (the acronym for "fin field-effect transistor") combined with laser-type transistors. In the case of the laser transistor, the specific architecture of such a transistor offers the possibility of obtaining germanium under tension comprising an n-type doping conformed so as to produce a laser transistor of the germanium on silicon type.

As is clear in the light of the above description, the invention thus makes it possible to use the principle of confinement of dislocations 50 on a material other than that of the channel.

Furthermore, the invention has the advantage of limiting the constraints imposed by the principle of confinement of the dislocations 50. The growth of the epitaxial layer 500 from the lateral flanks of the buffer layer 300 is advantageously not affected by the longitudinal crystalline defects developing in the buffer layer 300 through its formation from the substrate 100.

Moreover and particularly advantageously, the density of motifs of channels of the epitaxial layer 500 obtained using the method according to the invention is at least equivalent to twice the density of motifs that may be obtained by using photolithography steps. Moreover, the width (on a plane parallel to the surface of the substrate 100) and the roughness of the heteroepitaxed channels 525, 575 of the epitaxial layer 500 are solely determined by the growth of said epitaxial layer 500. Advantageously, the heteroepitaxed channels 525, 575 are formed in materials different from that of the substrate 100.

The invention is not limited to the embodiments described above and extends to all embodiments covered by the claims.

The invention claimed is:

1. A method for producing a crystalline layer, the method comprising:
    forming a masking layer on a crystalline substrate made from a first material, wherein the masking layer comprises at least one layer,
    forming at least one trench in the masking layer by selectively etching the masking layer, so that to reach the crystalline substrate at the bottom of the trench, thereby forming an access to the crystalline substrate, wherein the trench has a depth equal to a value Hc, wherein Hc=K·S·tan (θ), and wherein K is greater than 0.7, S is the width of the trench and θ is the angle of dislocations with respect to the plane of the substrate,
    forming a crystalline buffer layer in the trench formed in the masking layer by an epitaxial growth of the buffer layer from the crystalline substrate so as to give a crystalline structure to the buffer layer, wherein the growth of the buffer layer is stopped before a height of the crystalline buffer layer exceeds a depth of the trench,
    forming a protective layer on a top face of the buffer layer,
    selectively partially removing the masking layer, thereby extending the crystalline buffer layer from the crystalline substrate and forming a projection beyond the masking layer so that an upper part of the lateral flanks of the crystalline buffer layer is left uncovered, and
    forming a crystalline epitaxial layer by growth from said upper part of the lateral flanks of the crystalline buffer layer left uncovered.

2. The method according to claim 1, wherein the growth of the crystalline buffer layer comprises an epitaxial growth from the substrate.

3. The method according to claim 1, wherein the growth of the crystalline buffer layer comprises a deposition of said layer, followed by a crystallisation annealing.

4. The method according to claim 1, wherein the masking layer is chosen so as to prevent growth of the epitaxial layer from the masking layer.

5. The method according to claim 1, wherein the crystalline buffer layer is formed so as to leave uncovered a top face of the crystalline buffer layer in addition to said upper part of the lateral flanks of the crystalline buffer layer, in order to form said protective layer on said top face of the crystalline buffer layer left uncovered.

6. The method according to claim 1, wherein the protective layer is chosen so as to prevent growth of the epitaxial layer from the protective layer.

7. The method according to claim 1, wherein the formation of the epitaxial layer comprises an epitaxial growth from the upper part of the lateral flanks of the crystalline buffer layer left uncovered.

8. The method according to claim 7, wherein the formation of the epitaxial layer comprises an anisotropic growth directed perpendicular to the lateral flanks of the crystalline buffer layer left uncovered.

9. The method according to claim 1, wherein the formation of the epitaxial layer comprises a deposition of an amorphous material followed by crystallisation annealing of said material.

10. The method according to claim 1, wherein the formation of the crystalline buffer layer forming a projection beyond the masking layer comprises, after the growth of the crystalline buffer layer from the substrate, removing a part of the masking layer so as to uncover said upper part of the lateral flanks of the crystalline buffer layer.

11. The method according to claim 10, wherein the growth of the crystalline buffer layer from the substrate is effected so that the top of the crystalline buffer layer does not form a projection beyond the masking layer before the removing a part of the masking layer and forms a projection beyond the masking layer after the removing a part of the masking layer.

12. The method according to claim 10, wherein the removing a part of the masking layer is conducted by etching, wherein, prior to the removing a part of the masking layer, a protective layer is formed on the top face of the crystalline buffer layer so that the protective layer does not form a projection beyond the masking layer before the removing a part of the masking layer and forms a projection, together with the crystalline buffer layer, beyond the masking layer after the removing a part of the masking layer, and wherein the etching of the masking layer etches the masking layer selectively with respect to the protective layer and the crystalline buffer layer.

13. The method according to claim 12, wherein the protective layer is preserved when the epitaxial layer is formed.

14. The method according to claim 1, wherein the masking layer is formed in a single layer.

15. The method according to claim 1, wherein the masking layer is formed from a stack of layers.

16. The method according to claim 15, wherein the masking layer comprises a stack of layers, the materials of which differ from one layer to another and are configured so as to be removed selectively with respect to one another.

17. The method according to claim 1, wherein the masking layer comprises a first layer forming a stop layer surmounted by at least one second layer, wherein the removing a part of the masking layer is performed by etching the second layer and wherein the etching of the second layer takes place with stop on the first layer.

18. The method according to claim 9, wherein the removing a part of the masking layer is performed by etching and wherein the removing a part of the masking layer is performed by controlling an etching time.

19. The method according to claim 1, wherein the crystalline buffer layer is made from a material different from that of the epitaxial layer.

20. The method according to claim 19, wherein the material of the crystalline buffer layer and the material of the substrate have a lattice mismatch of less than 10%.

21. The method according to claim 19, wherein the material of the crystalline buffer layer and the material of the epitaxial layer have a lattice mismatch of less than 2%.

22. The method according to claim 1, wherein K is greater than 0.8.

23. The method according to claim 1, wherein K=1.

24. The method according to claim 1, wherein the crystalline buffer layer is made from a material identical to that of the epitaxial layer.

25. The method according to claim 1, wherein an electrically insulating interface layer is deposited between the substrate and the masking layer.

26. The method according to claim 1, wherein materials of the crystalline buffer layer and of the epitaxial layer are selected from the following combinations: an alloy of germanium-silicon (Si—Ge) with silicon (Si), an alloy of germanium-silicon-tin (Si—Ge—Sn) with an alloy of germanium silicon (Si—Ge), of gallium arsenide (GaAs) with germanium (Ge), of indium-gallium arsenide (InGaAs) with indium phosphide (InP), and of gallium nitride (GaN) with aluminium nitride (AlN).

27. The method according to claim 1, wherein the masking layer electrically insulates the epitaxial layer from the substrate.

28. The method according to claim 1, wherein, after the formation of the epitaxial layer on either side of the crystalline buffer layer, the crystalline buffer layer is removed selectively with respect to the epitaxial layer so as to leave in place a first channel and a second channel formed by the epitaxial layer; said first and second channels being electrically insulated.

29. The method of claim 1, wherein the masking layer comprises a stack of two layers having a selectivity of etching so that the first masking layer is consumed by etching at a quarter of an etching rate of the second masking layer.

30. A method for producing a crystalline layer, the method comprising:
forming a masking layer on a crystalline substrate made from a first material, wherein the masking layer comprises at least one layer,
forming at least one trench in the masking layer by selectively etching the masking layer, so that to reach the crystalline substrate at the bottom of the trench, thereby forming an access to the crystalline substrate, wherein the trench has a depth equal to a value Hc, wherein Hc=K·S·tan (θ), and wherein K is greater than 0.7, S is the width of the trench and θ is the angle of dislocations with respect to the plane of the substrate,
forming a crystalline buffer layer in the trench formed in the masking layer by an epitaxial growth of the buffer layer from the crystalline substrate so as to give a crystalline structure to the buffer layer, wherein the growth of the crystalline buffer layer from the substrate is continued until the crystalline buffer layer forms a projection beyond the masking layer,
forming a protective layer on both the top face and the lateral flanks of the buffer layer,
selectively partially removing the protective layer so that an upper part of the lateral flanks of the crystalline buffer layer is left uncovered, and
forming a crystalline epitaxial layer by growth from said upper part of the lateral flanks of the crystalline buffer layer left uncovered.

31. A method for producing a crystalline layer, the method comprising:
forming a masking layer on a crystalline substrate made from a first material, wherein the masking layer comprises at least one layer,
forming at least one trench in the masking layer by selectively etching the masking layer, so that to reach the crystalline substrate at the bottom of the trench, thereby forming an access to the crystalline substrate, wherein the trench has a depth equal to a value wherein Hc=K·S·tan (θ), and wherein K is greater than 0.7, S is the width of the trench and θ is the angle of dislocations with respect to the plane of the substrate,
forming a crystalline buffer layer in the trench formed in the masking layer by an epitaxial growth of the buffer layer from the crystalline substrate so as to give a crystalline structure to the buffer layer, wherein the growth of the crystalline buffer layer from the substrate is continued until the crystalline buffer layer forms a projection beyond the masking layer,
forming a protective layer on a top face of the buffer layer, wherein the formation of a protective layer on said top face of the crystalline buffer layer comprises:
deposition of a protective layer on the device;
removal of the entire protective layer on the lateral flanks of the crystalline buffer layer while preserving at least part of the protective layer on the masking layer and on said top face of the crystalline buffer layer;
removal of the protective layer on the masking layer leaving in place the protective layer on said top face of the crystalline buffer layer,
selectively partially removing the protective layer so that an upper part of the lateral flanks of the crystalline buffer layer is left uncovered, and
forming a crystalline epitaxial layer by growth from said upper part of the lateral flanks of the crystalline buffer layer left uncovered.

32. A method for producing a crystalline layer, the method comprising:
forming a masking layer on a crystalline substrate made from a first material, wherein the masking layer comprises at least one layer,
forming at least one trench in the masking layer by selectively etching the masking layer, so that to reach the crystalline substrate at the bottom of the trench, thereby forming an access to the crystalline substrate, wherein the trench has a depth equal to a value Hc, wherein Hc=K·S·tan (θ), and wherein K is greater than 0.7, S is the width of the trench and θ is the angle of dislocations with respect to the plane of the substrate,
forming a crystalline buffer layer in the trench formed in the masking layer by an epitaxial growth of the buffer layer from the crystalline substrate so as to give a crystalline structure to the buffer layer, wherein the growth of the buffer layer is stopped before a height of the crystalline buffer layer exceeds a depth of the trench,
forming a protective layer on a top face of the buffer layer, selectively partially removing the masking layer, thereby extending the buffer layer from the crystalline substrate and forming a projection beyond the masking layer so that an upper part of the lateral flanks of the buffer layer is left uncovered, forming a crystalline epitaxial layer by growth from the upper part of the lateral flanks of the buffer layer left uncovered, wherein the epitaxial layer is made from a material different from that of the buffer layer; wherein the epitaxial layer forms two portions extending on either side of the buffer layer, and each portion of the epitaxial layer forms a channel of a transistor.

33. The method according to claim 32, wherein the crystalline buffer layer is removed selectively with respect to the channels formed by the epitaxial layer.

34. A method for producing a crystalline layer, the method comprising:

forming a masking layer on a crystalline substrate made from a first material, forming at least one trench in the masking layer by selectively etching the masking layer, so that to reach the crystalline substrate at the bottom of the trench, thereby forming an access to the crystalline substrate, wherein the trench has a depth equal to a value Hc, wherein $Hc=K \cdot S \cdot \tan(\theta)$, and wherein K is greater than 0.7, S is the width of the trench and $\theta$ is the angle of dislocations with respect to the plane of the substrate, forming a crystalline buffer layer in the trench formed in the masking layer by an epitaxial growth of the buffer layer from the crystalline substrate so as to give a crystalline structure to the buffer layer, wherein the growth of the buffer layer takes place anisotropically so that a horizontal growth on a plane parallel to a surface of the crystalline substrate is dominant with respect to a vertical growth, wherein the buffer layer forms a projection above the masking layer, leaving at least a top face of the formed buffer layer uncovered and a part of the lateral flanks, wherein the buffer layer is lying on a plane parallel to the surface of the crystalline substrate, and wherein the lateral flanks are lying on a plane orthogonal;

forming a protective layer on at least the top face of the buffer layer and, optionally, the lateral flanks and a top face of the masking layer, selectively partially removing the protective layer, thereby exposing the lateral flanks of the buffer layer and preserving the protective layer on the top face of the buffer layer, and forming a crystalline epitaxial layer on the lateral flanks of the buffer layer.

* * * * *